United States Patent [19]

Shipman

[11] 4,054,010
[45] Oct. 18, 1977

[54] APPARATUS FOR GRINDING EDGES OF PLANAR WORKPIECES

[75] Inventor: Vern D. Shipman, Garland, Tex.

[73] Assignee: Headway Research, Inc., Garland, Tex.

[21] Appl. No.: 650,698

[22] Filed: Jan. 20, 1976

[51] Int. Cl.$^2$ .............................................. B24B 9/00
[52] U.S. Cl. ........................................ 51/55; 51/58; 51/154; 51/325
[58] Field of Search ................. 51/154, 325, 235, 161, 51/58, 131, 33 W, 55; 125/30 R

[56] References Cited

U.S. PATENT DOCUMENTS

| 835,964 | 11/1906 | Loesser | 125/30 R |
|---|---|---|---|
| 1,210,221 | 12/1916 | Shimans | 51/161 |
| 2,119,954 | 6/1938 | Lippold | 51/154 |
| 2,612,729 | 10/1952 | Walley | 51/154 X |
| 3,355,840 | 12/1967 | Bonning | 51/325 |
| 3,730,134 | 5/1973 | Kadi | 51/235 |

Primary Examiner—Harold D. Whitehead
Attorney, Agent, or Firm—Charles W. McHugh

[57] ABSTRACT

An apparatus for grinding the edges of planar workpieces such as semiconductor wafers, wherein an abrasive material is provided on the side of a flexible substrate which is mounted in a cantilevered fashion. By virtue of the flexibility in the substrate, the grinding surface can move in and out, if necessary, in order to accommodate any eccentricities or out-of-round portions of the planar workpiece. In a preferred embodiment for semiconductor wafer processing, the wafer is rotated at a speed in excess of 3000 rpm and as high as, say, 10,000 rpm. The grinding surface is preferably established on a round disc which is centrally supported on a shaft; and loading on the grinding surface is typically in a direction that is generally parallel to the longitudinal axis of the shaft. In order to distribute wear of the abrasive surface evenly around the disc, the disc is permitted to have a relatively slow rotational speed; the rapidly rotating wafer is used to induce rotation of the disc, and a friction restraint is employed to prevent the disc (and its grinding surface) from rotating too fast, i.e., more than about 100 rpm. Preferably, the abrasive material on the grinding surface constitutes diamond bort having a size of about 100 microns. In order to obviate difficulties that might arise due to mechanical resonance in the grinding system, it is preferred that the relative speed between the workpiece and the grinding surface be varied during a grinding operation. Thus, the workpiece may be rotated at a varying speed between, say, 3000 rpm and 1,000 rpm, during a single cycle; any bouncing that may occur as a result of resonance in the system will inevitably be distributed around the workpiece and not concentrated in a single spot. The substrate material on which the abrasive material (diamond bort) is mounted may be a polycarbonate sheet material having a thickness of 20 or 30 mils. Another substrate may be a cloth-like material shaped to form a diaphragm and supported during grinding operations by pressurized fluid in a chamber below the diaphragm.

19 Claims, 16 Drawing Figures

APPARATUS FOR GRINDING EDGES OF PLANAR WORKPIECES

This invention relates generally to methods and apparatus for grinding the edges of a frangible workpiece, and more particularly it relates to methods and apparatus for grinding the edges of semiconductor wafers, such as silicon wafers.

The semiconductor industry has now matured into a well-established and fairly sophisticated industry, involving many precise and elaborate processes for treating chips or dice of semiconductor material for making electronic devices having a multitude of diverse capabilities. Many of the manufacturing processes for fabricating semiconductor devices begin with the growing of an elongated crystal of semiconductor material, e.g., silicon or germanium, etc. A typical crystal may be in the shape of a cylindrical body having a diameter of about two or three inches and a length of several inches. Sometimes the initial crystal is ground about its periphery in order to achieve a truly cylindrical surface, and then a flat is ground along a line generally parallel to the longitudinal axis of the crystal. This flat subsequently serves as a reference point to orient the crystal and to identify different locations after it has been divided (typically by sawing with a diamond-impregnated saw blade) into relatively thin wafers having a thickness on the order of a millimeter or so. Even if the original crystal ingot is a perfect cylinder, however, the wafers realized from that cylinder will not necessarily be perfectly round (disregarding, for the time being, the machined flat); that is, the angle at which the crystal ingot is cut must correspond to a specific plane which bears a particular relationship to the crystalline lattice of the crystal, rather than the ingot's external geometry. Hence, wafers cut from a crystal may sometimes have the appearance of an oval or elliptical slice, even though they are cut from a purely cylindrical body.

It is well known, of course, that such semiconductor materials as silicon are notoriously brittle and frangible, and substantial care must be exercised in handling these devices. And, one reason that handling wafers is a rather sensitive task is that the saw blade which is used to cut wafers from a crystal tends to generate cracks in the crystalline material as it enters and leaves the crystal body. These minute cracks tend to serve as stress risers, and frequently lead to complete fracture of the wafer during subsequent heat treatment steps and/or mere handling of the wafers. It would be advantageous, therefore, if the edges of a semiconductor wafer could be ground so as to remove the sharp edges that exist at the intersection of a wafer's side and its periphery. That is, if for no other reason than to foster safer handling of a wafer, it would be advantageous to grind off the sharp edges thereof.

In addition to strictly mechanical considerations, there exists still another reason for wanting to grind the edges of a semiconductor wafer, namely, that the epitaxial deposition of materials onto the surface of a wafer sometimes results in the creation of so-called epitaxial spikes or epi's. These epitaxial spikes are extremely hard and usually quite sharp; when they extend upward beyond the plane defined by the top surface of the wafer, they pose a threat to the structural integrity of an optical mask, as well as presenting an obstacle to the proper placement of a mask over a wafer's top surface. Of course, any physical separation between a mask and the wafer's top surface can lead to fuzzy boundary lines in the device following exposure of the surface to radiation. That is, diffraction of light or other radiation about the edge of an optical mask which is held above a wafer's surface by an epi spike can produce inoperative or imprecise circuits in the semiconductor device being manufactured. As miniturization becomes even more actively pursued in making integrated circuits and the like, the preciseness with which the images contained in a mask are transferred to the surface of a wafer becomes even more important. Accordingly, it would be advantageous to completely obviate the formation of epitaxial spikes on a wafer; but, if the spikes cannot be completely eliminated, at least it would be helpful to cause them to form on a lowered edge profile—such that they would not extend so high as to protrude above the plane of the wafer's top surface. Since the majority of these epitaxial spikes do occur near the periphery of the wafer, establishing a tapered edge on the semiconductor wafer would have definite benefits in the manufacture of semiconductors.

While the desirability of accomplishing a grinding operation on materials which are as fragile as silicon wafers has long been recognized, there have heretofore been few ways in which actual grinding has been accomplished. One of these previously known ways has reportedly been with the use of a rigid grinding wheel having a formed groove in its periphery, with the shape of the groove corresponding to the desired shape of the ground edge of the wafer. In the use of such rigid grinding wheels, the wafer and the wheel are initially placed in the same plane, with the wafer being static. The rotating grinding wheel is then brought toward the wafer and carried around it, so that it sequentially makes contact with all peripheral portions of the wafer. In so far as is known, the use of formed grinding wheels has been almost universally a hand-controlled process—because there was no completely satisfactory way to automate such a system. Of course, when a substantial amount of skilled hand labor is involved in a modern manufacturing process, it will typically be an expensive process; too, there will often be certain variations in a product finished with hand labor that would not normally be found in a product achieved through automation.

Another technique for shaping the edge of a semiconductor wafer involves rotating the wafer about a central axis while directing a jet of fluid against the wafer's edge, with said fluid carrying a quantity of abrasive particles. Such a technique is similar to long-known sand blasting techniques which are used to remove dirt or other unwanted material from a structure. This technique of impinging a liquid jet loaded with abrasive particles against the edge of a frangible substrate can, no doubt, be used to advantage when the geometry of the substrate is precisely regular, whether it be exactly round or square, etc. But, when the edge of the substrate is not regular (and most semiconductor wafers are not regular), then positioning the jet so as to accomplish beveling—but not damage any part of the wafer which is located interiorly of the periphery—becomes a very delicate and difficult matter.

Still one other edge beveling technique is described in U.S. Pat. No. 3,742,593 to C. R. Smith, namely, mechanical cutting with a die or a sawing wire equivalent to the saws that are used to slice wafers from a crystalline slab. It might be said, then, that several ways have been suggested for grinding the edge of a silicon substrate; and yet—in spite of the several suggestions on how silicon substrates could be ground—the industry has not adopted these suggestions to any extent in the processing of whole wafers. The failure of the industry to adopt wafer edge profiling as a standard practice should make it apparent that there have been problems associated with previously suggested techniques that prevented the commercial exploitation of those techniques. Indeed, the percentage of semiconductor wafers that are presently ground or beveled is believed to be less than 1 percent of all of the wafers that are being processed in the U.S. today. And, even among the relatively few wafers that are being beveled, most of these are believed to be salvage operations wherein a substantial amount of labor had been invested in processing a wafer toward the eventual creation of integrated circuits and the like. That is, beveling the edge of a wafer to remove epitaxial spikes is one way of attempting to salvage a wafer which might otherwise have to be discarded—because it cannot be further processed with the spikes thereon. It is submitted, however, that if a reliable and economical process could be established for reproducably and controllably grinding the edges of frangible wafers and the like, the advantages to the semiconductor industry should be such as to almost dictate that all of the millions of wafers that are annually produced in the world should have their edges ground at a very early stage in the fabrication of semiconductor devices. Preferably the time for grinding the edge of a wafer would immediately follow the slicing of a wafer from its crystalline slab or ingot. Accordingly, it is an object of this invention to provide a reliable and dependable device for grinding the edges of generally planar workpieces, including semiconductor wafers.

Another object of the apparatus disclosed herein is to foster the establishment of a desired profile at the edges of a semiconductor wafer with said profile typically including rounded corners. In effect then, it is an object of the machine disclosed herein to accomplish something akin to a deburring operation, with appropriate safeguards against damaging the wafer—either electrically or mechanically.

It is a further object to provide an apparatus for grinding any of a variety of edge profiles with only a single grinding surface.

Still another object is to provide a means for quickly establishing a desired edge profile and a semiconductor wafer, e.g., providing such a profile within a time period on the order of five or ten seconds.

A further object is to provide an apparatus which is adjustable at will to accommodate workpieces having a wide range of sensitivities to grinding operations.

These and other objects will be apparent from a reading of the specification and the claims appended thereto, as well as reference to the accompanying drawings in which:

In brief, the invention includes an apparatus for grinding the edges of planar workpieces wherein an abrasive material is provided on a flexible substrate which is mounted in a cantilevered fashion. (It is assumed that most of the workpieces will be round or wafer-like, so the invention will be primarily described as operable on generally round workpieces.) By virtue of the flexibility in the substrate, the grinding surfaces can move in and out, if necessary, in order to accommodate any eccentricities or out-of-round portions of the planar workpiece. In a preferred embodiment for semiconductor wafer processing, the workpiece is rotated at a speed in excess of 3000 rpm and as high as, say, 10,000 rpm. The grinding surface is preferably established on a disc which is centrally supported on a shaft, and loading on the grinding surface is typically in a direction that is parallel to the longitudinal axis of the shaft. In order to distribute wear of the abrasive surface evenly around the disc, the disc is permitted to have a relatively slow rotational speed; the rapidly rotating wafer is used to induce rotation of the disc, and a friction restraint is employed to prevent the disc (and its grinding surface) from rotating too fast. Preferably, the abrasive material on the grinding surface constitutes diamond bort having a size of about 100 microns. In order to obviate difficulties that might arise due to mechanical resonance in the grinding system, it is preferred that the relative speed between the workpiece and the grinding surface be varied during a grinding operation.

In order that the invention may be clearly understood, one embodiment thereof will be described in substantial detail with regard to the grinding of the edge of a microelectronic substrate, such as a silicon or germanium wafer. By describing the invention with regard to semiconductor wafers, however, it is not meant to limit the invention to such wafers. In fact, the concepts which are to be thoroughly discussed herein should be readily adaptable to grinding the edge of most any frangible substrate, including contact lenses and other optical devices etc. Hence, it is presumed that those skilled in the art may find it possible to adapt the teaching herein to grinding a variety of materials, and the scope of the invention should be interpreted only by reference to the claims appended hereto.

Figure 1:
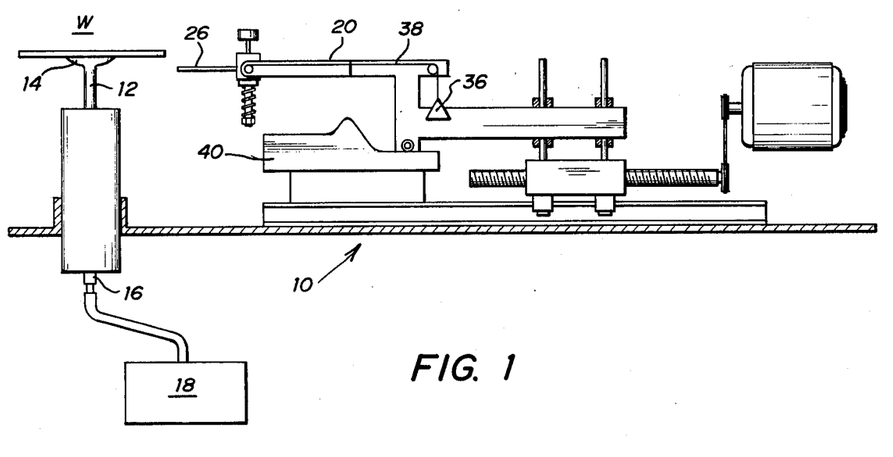
FIG. 1 is a side elevational view of an apparatus wherein the chuck for holding a workpiece remains at a stationary location and a grinding surface is brought to the chuck.
Figure 2A:
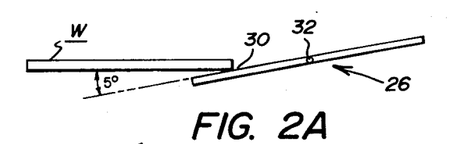
FIGS. 2A–2D constitute a set of diagrammatic views which illustrate the relative position between the workpiece and the grinding surface during one cycle or grinding operation.
Figure 2B:
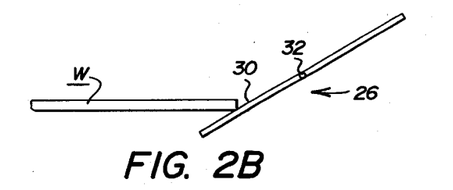
Figure 2C:
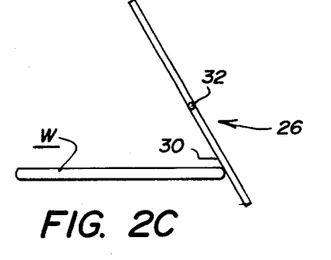
Figure 2D:
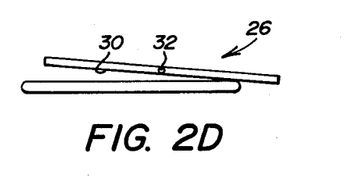

Referring initially to FIG. 1, a simplified embodiment of the invention includes a frame 10 on which a vacuum-operated chuck 12 is mounted. The use of vacuum chucks in the semiconductor industry is, of course, quite old; and vacuum chucks, per se, do not constitute a part of this invention. However, the use of a vacuum chuck to provide relative motion between a frangible substrate and a grinding surface on the order of 10,000 revolutions per minute is not known to be old; and, as will be explained more thoroughly hereinafter, an absolute differential in rotating speed on the order of 10,000 rpm constitutes a preferred manner of operation of the invention.

A preferred form of the vacuum chuck 12 is a horizontal platform 14 which is rigidly affixed to the end of a motor shaft 16 having a longitudinal bore therethrough. Affixed to the bottom end of the shaft 16 is a source of vacuum 18, which is shown diagrammatically because such sources are well known. Preferably, the motor shaft 16 constitutes the shaft of a permanent magnet AC motor of the type disclosed in U.S. Pat. No. 4,001,659 to Vern D. Shipman entitled, "Apparatus for Spinning a Microelectronic Substrate". This particular motor is preferred, for one reason, because it permits a rapid and reliable change in the speed of rotation of the workpiece mounted thereon. A fractional horsepower motor designed in accordance with the aforementioned patent to Shipman is readily adapted to rotate a silicon wafer at speeds in excess of 3000 rpm, including speeds up to (or even exceeding) 10,000 rpm. If the grinding surface is mounted in such a way that it too normally rotates, its rotation will usually be restricted to no more than 100 rpm. Hence, there will typically be a minimum differential of about 3000 rpm between the workpiece and the grinding surface. It has been found, however, that establishing a *single* speed difference between the workpiece and the grinding surface (e.g., 3000 minus 100 rpm) is not always conducive to the achievement of a uniform and efficient grinding operation. This is because there will generally be a speed, or a range of speeds, at which the natural resonance of the system may cause the grinding surface to vibrate with respect to the workpiece—with the result that the two elements bounce out of contact from time to time instead of maintaining a continuous rubbing or grinding contact. While this invention gives recognition to the fact that the resonant frequency of a system will inevitably be present, its effects are minimized to a great extent with the particular construction disclosed herein. This construction obviates the problems that may arise from a system's resonant frequency by changing the relative speed between the workpiece and the grinding surface during a grinding operation.

To illustrate how this feature operates, let it be assumed that it is desired to rotate a wafer at 5000 rpm; and, by coincidence, the natural resonant frequency of the supporting system for the grinding surface is near 5000 rpm. It is conceivable that vibrations introduced into the grinding surface by some eccentricity in the wafer might cause the grinding surface to begin to bounce away from and then swing back against the wafer instead of continuously bearing against the same. Furthermore, if such bouncing should occur in a single-speed system, it is almost certain that each bounce would occur at substantially the same place with every revolution of the wafer. Eventually, then, it would be found that the wafer had suffered substantial wear at the location where the grinding surface resumed contact with the wafer, while a section peripherally ahead of the worn section (where the grinding surface had bounced away from the wafer) would have had essentially no beneficial grinding. In order to obviate effects of this sort, the chuck 12 (and the attached workpiece W) can be driven at a varying rate of relative rotation during such time as the workpiece and the grinding surface are in contact. This varying rate preferably encompasses a range in excess of 1000 rpm. In the example given above, the chuck could advantageously be driven at a varying speed of between 5000 and, say, 7000 rpm. In fact, in a preferred embodiment, the change in the rate of relative rotation between the workpiece and the grinding surface encompasses a full range of 7000 rpm, by varying the rate of chuck rotation from 3000 rpm to about 10,000 rpm during a single grinding cycle. Of course, while the chuck is rotating at this relatively high speed (i.e., 3000 rpm or more), the grinding surface is being held still, or at least is rotating at a relatively slow speed, e.g., 100 rpm. If the grinding surface should happen to bounce away from the workpiece at any time during the revolution of the workpiece, it is practically certain that resonance in the system would not cause the grinding surface to again bounce away from the workpiece at the same spot during a subsequent revolution of the workpiece. Hence, at the conclusion of a grinding operation, all of the continuous edge of the workpiece will have been subjected to essentially the same grinding action.

Referring still to FIG. 1, the grinding apparatus further includes carriage means 20 for bringing a structure 22 toward a static motor housing 24. Mounted on the structure 22 is a flexible and generally planar substrate 26. The substrate 26 is mounted so as to provide a grinding surface that is supported in a cantilevered fashion, i.e., it is centrally supported on a shaft 28 which is carried by the movable structure 22. The forward side of the flexible substrate 26 has abrasive particles affixed thereto, so as to provide a grinding surface on a side of the substrate. Thus, the grinding surface disclosed herein for grinding the edges of a planar workpiece is significantly different from other grinding devices such as the grinding wheels shown in U.S. Pat. No. 2,561,929 to C. F. Klages. It is preferred that the grinding surface 30 on the disc 26 contain diamond particles having a size of about 100 microns. Of course, the selection of a size for the abrasive particles will normally be based upon considerations such as the speed at which it is desired to remove material from the workpiece, as well as the surface finish which one wishes to achieve on the completed workpiece. An abrasive surface with particles larger than 100 microns could be expected to remove material somewhat faster; and particles smaller than 100 microns would be expected to produce a smoother surface finish in the workpiece.

While diamond particles constitute the preferred abrasive media for grinding the edge of silicon wafers, it is true that diamond-coated substrates are relatively expensive, at least when a person considers only the initial purchase price. Hence, it is preferable that every bit of the grinding surface be utilized, so that none of the abrasive particles are discarded with a "worn out" disc without having accomplished some work. In one particularly useful embodiment, the substrate 26 is a disc having a diameter of about 3 inches, and the diamond particles are distributed around the periphery of the disc in a band that is about 1 inch wide. During a grinding operation, the disc 26 is permitted to rotate with respect to the workpiece so that substantially all of the abrasive-covered portion of the disc comes into contact with the edges of a wafer—assuming, of course, that a single grinding cycle lasts long enough to completely rotate the disc 26 about its mounting shaft 28.

If the substrate on which the grinding surface 30 is provided is in the shape of a rectangle or square rather than a disc, it would still be possible to move the substrate through a path that will cause all of the grinding surface to wear at a substantially constant rate. But, the mechanism for properly positioning a square or rectangular substrate is significantly more complicated than the apparatus for rotating a round substrate; hence, the embodiment shown herein including a round substrate is definitely preferred.

Referring additionally to FIG. 2, the preferred technique for grinding the edges of a semiconductor wafer begins with bringing the grinding disc 26 toward the wafer W at a relative angle so as to bring the grinding surface 30 into contact with the wafer W near the periphery thereof. At the time that the two elements 26, W first contact one another, it is advantageous that they be almost in the same plane, i.e., there may be a relative angle of only about 5° between them; and, normally first contact will be made by raising the disc upward until it touches a wafer which is already rotating, typically at a speed of 3000 rpm or more. (In FIG. 2A the relative angle between the wafer W and the disc 26 is exaggerated somewhat for clarity.) As the structure 22 and its mounted disc 26 are further elevated, the relative angle between the wafer and the disc will change, by virtue of the rotation of the disc 26 about axis 32. Subsequent angles between the wafer W and the grinding disc 26 are represented in FIGS. 2B, 2C and 2D, with FIG. 2D illustrating what could be the conclusion of a grinding operation for one wafer. That is, it could be the end of a grinding cycle because the disc 26 has already moved through an excursion angle of about 170°, from one extreme relative position below the wafer to another extreme relative position above the wafer. It would be possible, then, to simply raise the disc 26 or lower the wafer W out of contact at this time, and then introduce a fresh wafer whose edges are to be ground. However, to improve the surface finishing on the edge and to cause all operations to start and end at the same location, the relative positions of the elements W, 26 in FIG. 2D are established as "midpoint" positions in a grinding cycle. The remainder of the preferred cycle is essentially the reverse of the first half of the cycle, such that the wafer and the disc separate with substantially the same relative angle that they had when they first made contact, as indicated in FIG. 2A.

Figure 3:
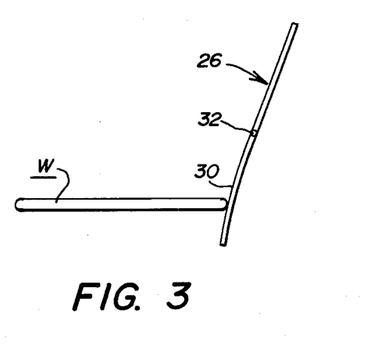
FIG. 3 is a diagrammatic view of the flexure during a grinding operation that would be expected in a flexible grinding substrate mounted in a cantilevered fashion.

Since FIGS. 2A–2D might possibly suggest that the disc 26 remains stiff and straight at all times, it is perhaps appropriate at this point to emphasize that the disc 26 should be at least somewhat flexible; and FIG. 3 is intended to make it clear that—in a preferred embodiment—the disc 26 will yield somewhat as a result of pressure exerted by a workpiece W. Indeed, it is the resiliance in the substrate 26 that permits the grinding surface 30 to effectively follow the edge of a wafer and maintain a reasonably constant grinding action on the wafer in spite of any eccentricities in its periphery. Thus, even the "flat" which is deliberately machined into a semiconductor wafer can receive some grinding action with a device shown in FIG. 3. And, in theory, a substantial protuberance on the wafer edge will not introduce such an excessive force between the wafer and the disc that a fracture might be caused in the brittle wafer. Too, permitting the flexible disc 26 to accommodate eccentricities in a wafer's edge means that the structure 22 need not be perpetually moving in and out in an attempt to track variations in the wafer. With the wafer typically rotating at speeds as high as 10,000 rpm, it would be exceedingly difficult to rapidly move a structure 22 having any significant mass at a linear velocity in a radial direction (with respect to the wafer) so as to resiliance to peripheral eccentricities. The exact resilience in the grinding disc 26 may well be a matter of choice that is a function of the variations that are expected to be typical of the workpiece. That is, if the out-of-roundness of the workpieces is not expected to exceed a couple of millimeters, then the resiliance in the disc 26 can obviously be much less than if the disc is expected to have an excursion of, say, 5 millimeters. Too, the sensitivity of the workpiece may be a factor in selecting the material for a disc 26. For silicon wafers, which are extremely hard as well as brittle, a suitable material for the grinding disc 26 is polycarbonate having a thickness of about 0.020 inch; substrates as thick as 0.035 inch have also been used, but they are significantly stiffer than the thin polycarbonate sheets. Synthetic diamond particles impregnated in such a substrate have been successfully tested on thousands of silicon wafers with essentially negligible breakage, provided that grinding rates are held at 10 seconds or more. That is, the edge grinding of a 3 inch silicon wafer has been successfully accomplished in a time period as short as five seconds; but attempting to remove too much material in too short a period will naturally increase the risk of breakage until it eventually becomes economically impractical. If the edge of a silicon wafer is to be ground to a "pillowed" profile like that shown in FIG. 4, and the material to be removed in the region indicated by numeral 150 is about 3 mils, then a grinding cycle lasting about 25 or 30 seconds should be satisfactory; that is, such a rate should be tolerable for the mass production of wafers as well as producing a negligible breakage rate.

The maximum lever arm at which the wafer W presses against the grinding surface 30 would be about 1¼ inches in the embodiment of FIG. 1; and it has been found that a tolerable radial force on silicon wafers is about four ounces. Hence, the restraining torque that should be provided to hold the disc 26 in a grinding position against the wafer edge is about 6 inch-ounces. This restraining torque, which tends to rotate the disc 26 in a clockwise direction (as seen in FIG. 3) is readily achieved by connecting the shaft 34 (coincident with axis 32 about which the disc rotates) with a coil spring or a counterweight. Of the two torque-imposing devices, a counterweight 36 attached to the end of a cord 38 which is wrapped around the shaft 34 provides a more uniform force and therefore is preferred over a coil spring.

Referring now to another embodiment of an apparatus for grinding the edges of a wafer or the like, the device shown in FIGS. 5 and 6 will now be described. A motor housing 124 is mounted so that it will pivot about shaft 126 through an angle of several degrees. As before, the preferred motor is one that has a hollow rotor shaft 116 so that the bottom end of the shaft can be placed in communication with a source of vacuum 118. On the top end of shaft 116 is a vacuum chuck 112, and a workpiece W is shown in a mounted position on top of the chuck. Near the motor housing 114 are positioned two grinding substrates 126A and 126B, which are mounted in a cantilever fashion with respect to anchors 127A and 127B. The distal end of flexible substrate 126A has a normal rest position slightly below the plane occupied by the workpiece W when the workpiece is initially placed on the vacuum chuck 112. The distal end of flexible substrate 126B has a normal rest position slightly above the plane occupied by the workpiece W when said workpiece is initially mounted on the vacuum chuck 112. A grinding surface 130 is provided on one face of each of the flexible substrates 126A, 126B near the distal end thereof.

Figures 5, 6, 7, 8, 9, 11, 12, 13:
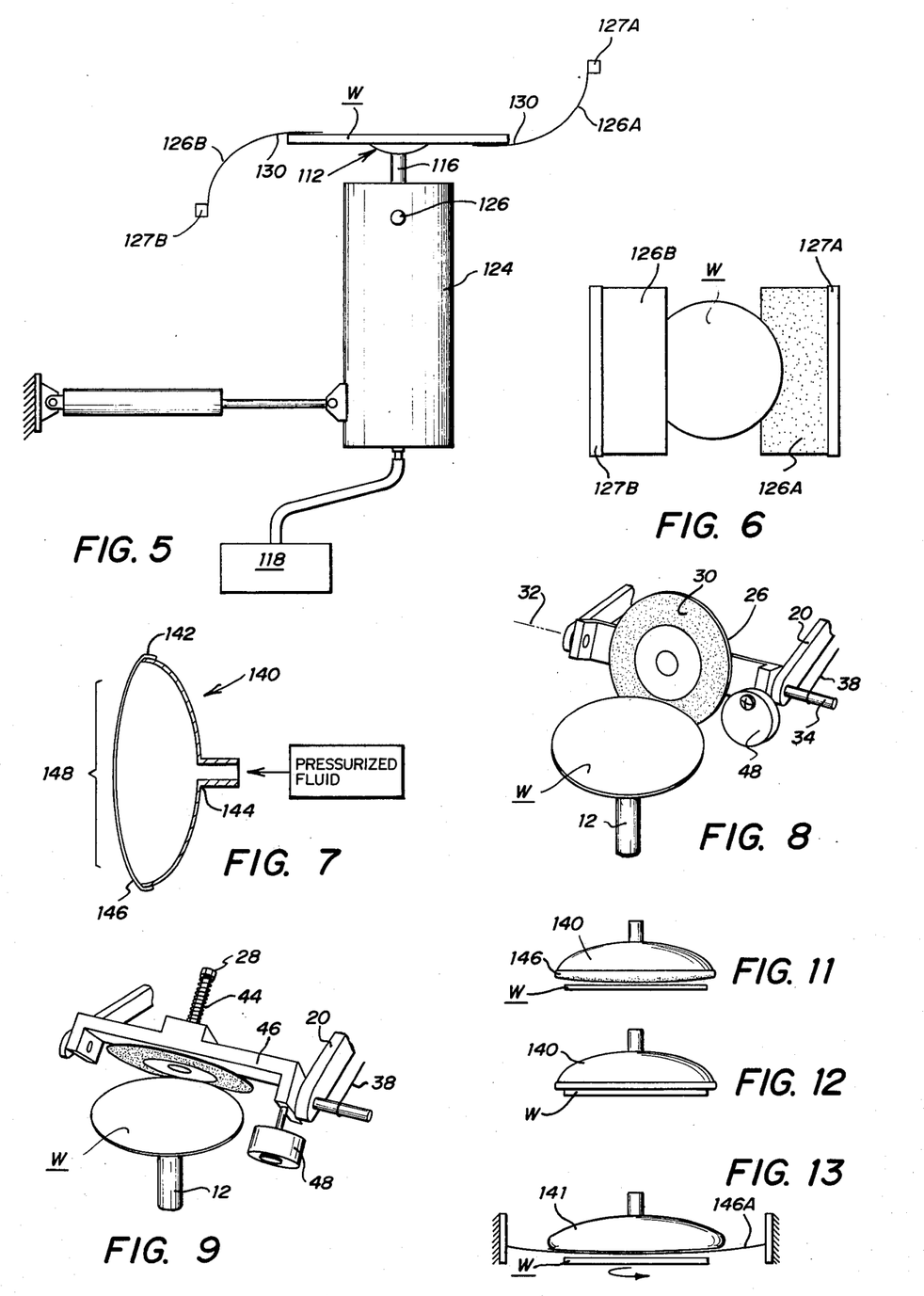
FIG. 5 is a diagrammatic side view of an apparatus wherein a motor housing tilts to bring the workpiece into contact with two cantilevered grinding surfaces.
FIG. 6 is a top view of the apparatus shown in FIG. 5.
FIG. 7 is a sectional view of another embodiment of a flexible grinding surface wherein a pressurized fluid supports a diaphragm on which abrasive media are held.
FIG. 8 is an enlarged perspective view of a grinding disc in contact with the edge of a workpiece, e.g., a 3 inch diameter silicon wafer.
FIG. 9 is another perspective view of the apparatus shown in FIG. 8, and the grinding disc and the workpiece being in different relative positions.
FIGS. 11 and 12 are diagrammatic views, in elevation, of a grinding device positioned above a wafer—for polishing a face of the wafer.
FIG. 13 is another embodiment of a face-polishing apparatus for a semiconductor wafer, shown diagrammatically and in elevation.
Figure 10:
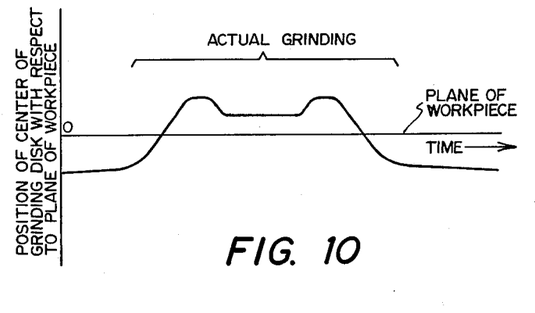
FIG. 10 is a representative plot of the several positions of a grinding surface with respect to the plane of a workpiece, during one exemplary grinding cycle.

In operation of the embodiment shown in FIGS. 5 and 6, a workpiece such as a silicon wafer is brought to a workstation at the end of motor housing 124 and is generally centered over the chuck 112. A vacuum is established with device 118 and the motor is energized to rotate the wafer at a substantial speed. The motor housing 124 would then be rotated in a clockwise direction about supporting shaft 126, thereby causing the lower edge of rotating wafer W to bear against the grinding surface 130 provided on substrate 126A. At the same time, the grinding surface 130 on cantilevered substrate 126B bears against the top edge of wafer W. By rotating the motor housing 124 still further, the relative angle between the wafer W and the two grinding surfaces 130 will be altered, such that essentially any desired profile could be obtained in the wafer's edge. As in the previously described embodiments, there is no rigid structure behind the flexible substrates 126A, 126B, so that said substrates are free to move backward as a result of any protrusion or bump on the periphery of a wafer W. Hence, a frangible and brittle wafer is not likely to be broken; yet, the sharp corners around the periphery of the workpiece can be ground and/or polished, depending upon the nature of the abrasive material on the grinding surfaces. Of course, it would also be possible to provide means for moving the anchor bars 127A, 127B inward toward the mounting shaft 126 during a grinding operation, which would also change the relative angle between the wafer W and a grinding surface 130. If said anchor bars 127A and 127B were brought inwardly to positions where they were respectively over and under the edges of a wafer, then essentially any part of a wafer's periphery could be ground. It will perhaps be seen, then, that the apparatus shown in FIGS. 5 and 6 is functionally equivalent to the apparatus shown in FIG. 1, with the main difference being that two cantilevered grinding surfaces are employed rather than one. In both of these embodiments, however, it will be understood that the preferred grinding action (by the grinding surface on the workpiece) is in a direction that is substantially parallel to the general plane of the grinding surface. Thus, in order to accomplish effective grinding there is substantial stiffness in the system in a direction parallel to the plane of the grinding surface. And, the flexibility or resilience in the grinding system is in a direction perpendicular to the grinding surface, i.e., in a direction which is radial with respect to the workpiece.

Still another embodiment of a flexible grinding surface for grinding the edges of a semiconductor substrate is shown in FIG. 7, which includes a rigid and air-impervious shell 140 of metal or the like which had leading edges 142 that protrude beyond the base 144. Stretched across the base 144 in a rather loose fashion is a diaphragm 146 which is sealingly attached to the leading edges of the shell. The disphragm is also of an air-impervious material, and it may be of a tightly woven nylon which is coated on its interior surface with a flexible resin or the like so as to seal the diaphragm. On the exterior surface of the diaphragm, and in the central region indicated by the numeral 148, abrasive media such as diamond particles are provided, so as to constitute a flexible grinding surface. The diaphragm is preferably not coated over its entire exterior surface, since this would be wasteful of abrasive material. That is, attempting to grind the edge of a wafer at a position which is very near the supporting edge 142 of the shell 140 would obviate the resiliance that is provided by the pressurized fluid behind the diaphragm. In other words, the "pillow" effect of the apparatus shown in FIG. 7 is reduced at locations near the edge of the diaphragm. And, since it is the resiliancy of a flexible grinding surface that is so important when the workpieces are frangible, restricting the grinding to regions near the center of the diaphragm is preferred. The shell's base 144 is adapted to be connected to a source of pressurized fluid such as air, so as to fill the space between the diaphragm and the shell with a fluid that will cause said diaphragm to bulge outwardly from the shell's edges. The adhesive which holds the abrasive media on the cloth-like diaphragm 146 must, of course, be pliable in order to permit the diaphragm to flex with an appropriate degree of freedom. A suitable adhesive has been found to be a synthetic rubber of the type commonly used to seal fuel tanks in aircraft, etc.

In operation, the device shown in FIG. 7 would work substantially the same as the planar substrate 26 shown in FIG. 1, in that the grinding surface 148 would have sufficient resiliance to follow eccentricities in the periphery of a wafer. Naturally, the pressure of the fluid trapped behind the diaphragm 146 should not be so high as to cause the diaphragm to behave like a rigid surface, and a pressure of a few psi (e.g., 5 to 8 psi) above atmospheric pressure will typically be enough to cause the diaphragm to bulge outwardly in a suitable manner. During the grinding of a wafer, a force of about four ounces applied by the grinding surface 148 in a radial direction with respect to the wafer has been found to provide adequate material-removal rates while still being tolerable by the brittle wafers; and forces as high as 6-8 ounces can even be satisfactory for some semiconductor wafers. But the incidence of breakage in semiconductor wafers will likely cause significant losses when grinding forces become higher than, say, 8 or 10 ounces, in a direction other than purely radial.

In another embodiment, an apparatus like that shown in FIG. 7 has a slightly porous diaphragm 146, so that a fluid which pressurizes a cavity behind the diaphragm may flow or "leak" through the diaphragm, helping to keep the abrasive surface on the diaphragm clean. The pressurizing fluid may naturally be any conveniently available fluid such as air or water. While compressed air having a pressure in the range of about 2-8 psig is particularly advantageous because of the resiliency it provides, the use of water as a pressurizing liquid is more advantageous in heat removal. And, with a wafer rotating at a speed of at least 3000 rpm, it is inevitable that there will be at least some heat generated during grinding and/or polishing of a workpiece. Hence a liquid such as cool water can be a useful medium with which to support the diaphragm in an operating position. A pump or other source of pressurized water would naturally be provided to furnish a modest flow of water during grinding operations, and that flow of liquid would serve not only to cool the surface of the wafer but also to carry off any minute particles that might otherwise remain on the surface and perhaps cause a scratch or other structural damage.

In addition to use of the flexible diaphragm 146 to grind the edges of wafers, said diaphragm could also be used to polish the sides or "faces" of wafers. FIGS. 11 and 12 illustrate how such a polishing technique can be employed with a flexible diaphragm 146. In FIG. 11 the shell 140 is shown in an un-pressurized condition, such that the diaphragm 146 is in a relaxed mode. In FIG. 12 the cavity within shell 140 has been pressurized, such that the diaphragm 146 has now been moved into contact with a rotating wafer. The relative size between the diaphragm 146 and the wafer W will have some effect on the polishing action that is achieved. That is, there will be a greater pressure exerted by the diaphragm 146 in the center thereof; so, making the diaphragm 146 about the same size as the wafer W would contribute to a more nearly uniform cutting rate on the wafer. That is, the relative velocity between the wafer and the diaphragm is higher near the periphery of the rotating wafer than it is near the center thereof. Therefore, arranging the relative sizes of the pieces so there will be a lower diaphragm pressure where the relative velocity is highest, and a higher pressure where the relative velocity is lowest, will tend to even out the polishing process over the entire face of the wafer. Of course, the desirability of having a polished wafer face is not new, and U.S. Pat. Nos. such as 3,905,162 to J. E. Lawrence and J. C. Santoro explain one reason for wanting to polish a wafer face.

It is said by those familiar with grinding the faces of semiconductor wafers that there is potential damage to the surface of the wafer to a depth significantly greater than the size of the abrasive particles that are used in grinding that surface. Hence, if it is desired to have surface damage to a depth no greater than, say, 20 microns, then the abrasive grit which is used to grind said surface should have a size much less than 20 microns, e.g., 6 or 7 microns. In the past, it has been customary to place wafers in contact with rigid polishing wheels, and to supply a quantity of loose abrasive material (usually in a slurry) between the wafer's surface and the smooth polishing wheels. To change from one size grit down to a smaller size, however, has meant a meticulous cleaning job—because leaving even a single large particle on the wafer or the polishing wheels can prevent the achievement of the desired surface finish when the polishing wheels are rotated. With the present invention, this changing from one size grit down to the next smaller size is more readily accomplished, because there should not be any loose particles in the work area (other than perhaps those few particles that have been dislodged from the diaphragm 146 but which have not yet been washed away). Stepping down from one grit size to another with this invention is accomplished by merely translating a second shell and its diaphragm into the position formerly occupied by a first, with the second having on its exterior surface smaller abrasive particles than the first diaphragm had. Too, using an air bag or the like behind a flexible diaphragm eliminates the necessity to align rigid polishing wheels with any great precision, etc. And there is less risk of grinding too much off one side of the wafer and not enough off the other side, such that a tapered wafer would be produced.

FIG. 13 shows still another embodiment wherein an air bag 141 is positioned behind a static diaphragm or sheet 146A having an abrasive portion on its lower side. In this embodiment, the diaphragm does not constitute a wall in common with the wall of the cavity that is pressurized.

Figure 4:
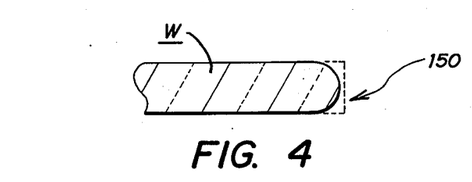
FIG. 4 is a fragmentary side view of the edge of a workpiece whose original sharp corners have been ground off to provide a "pillowed" profile.

Referring again to FIG. 1 and additionally referring to FIGS. 8 and 9, the operation of a first embodiment of the invention would typically begin with moving a grinding substrate 26 toward a workpiece W which has already been positioned on top of a rotative member 12. This movement can be accomplished by a double-acting hydraulic cylinder, or a mechanical screw drive, or any other well known mechanism for causing a carriage 20 to translate along a path. The initial contact between the grinding surface 30 on substrate 26 will preferably be at a relatively small angle with respect to the workpiece—assuming that a profile like that shown in FIG. 4 is desired. After bringing the rotating workpiece W into contact with the grinding surface 30, the substrate 26 is then tilted with respect to the workpiece by elevating the shaft 34 upon which the substrate can pivot. This may be conveniently accomplished by use of a cam 40 which is positioned to cause the carriage 20 to rise. Eventually, the carriage 20 will have advanced far enough toward the chuck 12 that the substrate 26 will have been tilted into a position such as that shown in FIG. 8, by virtue of contact with the workpiece which rotates but does not otherwise move. Appropriate grinding pressure is maintained on the workpiece W at all times by virtue of the weight 36 at the end of cord 38, which contributes a controlled torque to the substrate 26.

In due time, the relative position of the substrate 26 and the workpiece W will likely appear much like that shown in FIG. 9, wherein the pivot axis 32 is now above the workpiece. In moving to this position, substantially all of the workpiece's edge will have been contacted by the grinding surface 30. Indeed, if the workpiece and the grinding surface initially have a relative angle of about 5°, then moving that grinding surface through an angle of 90° or more will insure that both the bottom and top sharp corners of the workpiece's edge will have been contacted by the grinding surface. The profile shown in FIG. 4, however, is achieved by moving the workpiece and the grinding surface through a relative angle more nearly approaching 170°.

Also shown in FIG. 9 is a spring 44 which abuts the bottom of yoke 46 and the end of shaft 28 on which the substrate 26 is mounted. By adjusting the compression in this spring, the amount of relative rotation which the substrate 26 is permitted to have (about shaft 28) can be varied; as described hereinbefore, the preferred rotational speed is less than 100 rpm. Of course, permitting the disc to rotate at all (in response to the relatively high rotational speed of the workpiece) is for the primary purpose of distributing wear evenly throughout the entire disc 26. Also visible in FIG. 9 is a counterweight 48 that helps balance the grinding system with respect to axis 32, so that grinding forces on the workpiece are substantially the same at all times.

While the above-described embodiment included a fixed motor housing and a movable holder for the grinding surface, it should be apparent to those skilled in the art that the relative movement between these two elements could be reversed, such that the grinding surface remains in a fixed workstation and the wafer is moved toward the grinding surface. Still other modifications and variations in the structure described herein should make themselves apparent. Thus, it should be evident that some deviation from the exact structure shown in the drawings could be made without departing from the spirit and scope of the invention, which is defined by the claims appended hereto.

What is claimed is:

1. Apparatus for grinding the generally planar edges of a frangible and disc-shaped workpiece, comprising:
   a. a chuck for holding the disc-shaped workpiece near the center thereof, such that its entire periphery is exposed for being ground;
   b. a flexible and generally planar substrate supported in a cantilevered fashion and having a grinding surface on one side for contacting a peripheral portion of the workpiece;
   c. means for rotating the workpiece with respect to the grinding surface when they are in contact, with said means being effective to rotate the workpiece at a speed of at least several hundred revolutions per minute;
   d. carriage means for bringing the chuck and the substrate toward one another at a relative angle so as to bring the grinding surface into contact with the workpiece near the periphery of the workpiece; and
   e. means for changing the angle of inclination at which the workpiece engages the grinding surface during the time they are in contact with each other, whereby a planar grinding surface is effective in achieving a ground edge which does not lie in a singular plane.

2. The apparatus as claimed in claim 1 wherein the cantilevered substrate constitutes a disc which is rotatably supported about a central axis, and further including means for biasing the substrate and its grinding surface against substantial rotation while the rotating workpiece is in contact therewith.

3. The apparatus as claimed in claim 2 wherein the means for rotating the workpiece is adapted to rotate it at speeds in excess of 3000 rpm, and the means for biasing the grinding surface is effective to bias it against rotation at more than 100 rpm.

4. The apparatus as claimed in claim 1 wherein the means for rotating the workpiece with respect to the grinding surface includes means for providing a varying rate of relative rotation during such time as the workpiece and the grinding surface are in contact.

5. The apparatus as claimed in claim 4 wherein the means for varying the relative rotation between the workpiece and the grinding surface is a permanent magnet AC motor which is adapted to provide a differential in rotation that exceeds 1000 rpm.

6. The apparatus as claimed in claim 1 wherein the flexible substrate is in the form of a disc of relatively thin plastic material that is supported only at its central region, and the grinding surface is adjacent the periphery of the disc.

7. The apparatus as claimed in claim 1 wherein said means for changing the angle of inclination at which the workpiece engages the grinding surface during the time that they are in contact is effective to change said angle by as much as 90°.

8. The apparatus as claimed in claim 7 wherein the excursion angle through which the workpiece and the grinding surface pass as they move from a first extreme relative position to the other extreme relative position is about 170°.

9. The apparatus as claimed in claim 1 wherein the workpiece is a wafer of semiconductor material and the grinding surface contains diamond particles having a size of about 100 microns.

10. The apparatus as claimed in claim 1 wherein the flexible substrate is a disc having a diameter of about 3 inches and wherein the grinding surface includes abrasive particles distributed around the periphery of the disc in a band that is about 1 inch wide, and further including means for bringing substantially all of the abrasive-covered portion of the disc into contact with the edges of a workpiece during a single grinding cycle.

11. An apparatus for grinding the planar edges of a substantially round and flat workpiece, comprising:
    a. an vacuum chuck for holding the workpiece near the center thereof, such that the planar edges are unsupported and exposed;
    b. motor means for rotating the chuck and the attached workpiece at a relatively high speed of at least 3000 rpm;
    c. a flexible substrate supported in a cantilevered fashion adjacent the chuck, with said substrate having abrasive media on the side which faces the workpiece;
    d. means for translating the chuck with respect to the cantilevered substrate in order to bring the grinding surface into contact with an edge of the workpiece near the periphery of said workpiece, whereby rotating the workpiece by 360° will cause the entire edge of the workpiece to be contacted by the grinding surface; and
    e. means for controlling the grinding pressure on the edges of the workpiece as a result of contact with the grinding surface, including means for maintaining torque applied by the cantilevered grinding surface at a given value in spite of any changes in the angle of contact between the workpiece and the grinding surface.

12. The apparatus as claimed in claim 11 and further including a cam which controls the relative inclination between the workpiece and the grinding surface as the chuck translates with respect to the cantilevered substrate.

13. The apparatus as claimed in claim 11 wherein the flexible substrate is a sheet of thermoplastic material having a thickness of about 0.020 inch and the abrasive material includes diamond particles.

14. The apparatus as claimed in claim 11 wherein a counterweight is connected to said flexible substrate with a flexible member, and said counterweight is rigged so as to bias the flexible substrate to a given position at which the workpiece and the grinding surface have a first relative angle.

15. The apparatus as claimed in claim 11 and further including means for tilting the cantilevered substrate with respect to the workpiece during a grinding cycle so as to alter the angle of contact between the workpiece and the grinding surface, whereby that portion of the workpiece's edge from which material is being removed is varied during a grinding cycle.

16. The apparatus as claimed in claim 1 wherein the cantilevered substrate constitutes a rotatable disc which is mounted in a yoke, and said yoke is rotatably supported about an axis which is perpendicular to the axis of rotation of the disc-shaped workpiece, and said yoke being rotatable through an angle of as much as 170°.

17. The apparatus as claimed in claim 16 wherein the yoke's axis of rotation passes through the plane of the generally planar substrate.

18. The apparatus as claimed in claim 17 wherein a counterweight is positioned on one side of the substantially planar substrate at a position to offset the weight of the yoke on the other side of the substantially planar substrate, whereby grinding forces on the workpiece are substantially the same at all times, including those times when the grinding surface is approximately parallel to a horizontal workpiece as well as those times when the grinding surface is perpendicular to said workpiece.

19. The apparatus as claimed in claim 2 wherein said means for biasing the substrate against substantial rotation constitutes a coiled spring having a first end which bears against the rotatable substrate and having its other end bearing against a non-rotating structure.

* * * * *